US007081842B2

(12) United States Patent
Cranford, Jr. et al.

(10) Patent No.: US 7,081,842 B2
(45) Date of Patent: Jul. 25, 2006

(54) ELECTRONIC COMPONENT VALUE TRIMMING SYSTEMS

(75) Inventors: Hayden Clavie Cranford, Jr., Cary, NC (US); Louis Lu-Chen Hsu, Fishkill, NY (US); James Stephen Mason, Eastleigh (GB); Gareth John Nicholls, Brockenhurst (GB); Philip Murfet, Stockbridge (GB); Samuel Ray, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/967,756

(22) Filed: Oct. 18, 2004

(65) Prior Publication Data

US 2005/0127978 A1 Jun. 16, 2005

(30) Foreign Application Priority Data

Dec. 10, 2003 (GB) ................................ 0328574.9

(51) Int. Cl.
*H03M 1/10* (2006.01)

(52) U.S. Cl. .......................... 341/121; 326/30; 326/82; 326/86; 326/90

(58) Field of Classification Search ................ 341/118, 341/120, 121, 158, 161–163; 326/30, 82
See application file for complete search history.

(56) References Cited

U.S. PATENT DOCUMENTS

| | | | | |
|---|---|---|---|---|
| 4,728,881 | A * | 3/1988 | Evans et al. | 323/353 |
| 5,134,311 | A | 7/1992 | Biber et al. | 307/270 |
| 5,194,765 | A * | 3/1993 | Dunlop et al. | 326/87 |
| 5,652,538 | A * | 7/1997 | Boudry et al. | 327/403 |
| 5,666,078 | A * | 9/1997 | Lamphier et al. | 327/108 |
| 5,955,894 | A * | 9/1999 | Vishwanthaiah et al. | 326/86 |
| 6,026,456 | A | 2/2000 | Ilkbahar | 710/101 |
| 6,472,897 | B1 * | 10/2002 | Shyr et al. | 324/765 |
| 6,570,402 | B1 * | 5/2003 | Koo et al. | 326/30 |
| 6,734,702 | B1 * | 5/2004 | Ikeoku et al. | 326/30 |
| 6,828,820 | B1 * | 12/2004 | Ohno | 326/30 |

* cited by examiner

*Primary Examiner*—Rexford Barnie
*Assistant Examiner*—Khai Nguyen
(74) *Attorney, Agent, or Firm*—Kunzler & Associates

(57) ABSTRACT

Described is a system for trimming the value of an electronic component. The system comprises: at least one trimming component, each trimming component having an associated switch for selectively connecting that trimming component to the electronic component in response to a corresponding bit in a control vector. A comparator is included for generating an output bit having a first value if a net value of the electronic component and any connected trimming components differs from a desired value. A controller connected to the switches and the comparator generates the control vector in dependence on the output of comparator, the controller comprising a shift register for sequentially receiving successive output bits from the comparator; wherein the control vector comprises the contents of the shift register and wherein a bit of said first value in control vector effects switching of the corresponding switch.

27 Claims, 5 Drawing Sheets

ELECTRONIC COMPONENT VALUE TRIMMING SYSTEMS

BACKGROUND OF THE INVENTION

1. Field of the Invention

The present invention generally relates to electronic component value trimming systems and particularly relates to a system for trimming the effective value of an electronic component such as a resistor in an integrated circuit (IC) to a desired value.

2. Description of the Related Art

Conventional techniques for trimming the effective value of an electronic component to a desired or target value comprise selectively connecting a main component to one or more trimming components via a network of switchable interconnections. Such systems can compensate for the tolerance of IC components such as resistors and provide a more accurate value than possible with an uncompensated component. There are applications where well controlled IC resistor networks are desirable. One such application, for example, is in the termination of transmission lines to optimise signal quality.

Many conventional systems have the disadvantage of static power consumption. This can be particularly problematical in low power applications. In addition, where such systems involve the distribution of an analogue voltage signal, there can be susceptibility to interference and error. Conventionally, these problems have been addressed by digital systems at the expense of increased complexity and increased silicon real estate.

An example of a conventional trimming system is described in U.S. Pat. No. 5,134,311. Here, the output impedance of a voltage driver is adjustable. Multiple parallel pull up and pull down transistors are located in the output of the driver. The output impedance of the driver is selected by activating a corresponding group of the transistors.

Another example of a conventional trimming system is described in U.S. Pat. No. 6,026,456. Here, a termination network for optimising a bus impedance is described. The network has a higher impedance than the bus impedance to be controlled.

Yet another example of a conventional trimming system is described in U.S. Pat. No. 5,652,538. Here, there is described a digital system in which parallel elemental conductances are switched in and out of circuit by a digital control signal to obtain a desired impedance. In this design, there is also significant overhead in the system control logic. This overhead is a disadvantage for applications in which there are multiple components to be trimmed on an IC. Either the control logic has to be replicated to trim individual or groups of components, or the control logic has to trim all components centrally. The latter may involve complex routing of a control bus across the IC. The control bus may have many bits, further complicating such routing.

It would therefore be desirable to provide a component value trimming system for IC applications in which the aforementioned problems associated with conventional systems are alleviated.

SUMMARY OF THE INVENTION

In accordance with the present invention, there is now provided a system for trimming the value of an electronic component, the system comprising: a plurality of trimming components, each trimming component having an associated switch for selectively connecting that trimming component to the electronic component in dependence on a corresponding bit in a control vector; a comparator for generating an output bit having a first value if a net value of the electronic component and any connected trimming components differs from a desired value; and, a controller connected to the switches and the comparator for generating the control vector in dependence on the output of comparator, the controller comprising a shift register for sequentially receiving successive output bits from the comparator, wherein the control vector comprises the contents of the shift register and wherein a bit of said first value in control vector effects switching of the corresponding switch.

In one preferred embodiment of the present invention, the switches are initially closed. In another preferred embodiment of the present invention, the switches are initially open.

The shift register preferably comprises a plurality of latches connected in series between first and last latches, the output of the comparator being connected to the first latch in the series. In one preferred embodiment of the present invention, the controller comprises first logic for applying a clock signal to the latches until all latches in the series have received an output bit from the comparator. The first logic may comprise a counter for disabling the clock signal on detection of a predetermined number of cycles in the clock signal. In another embodiment of the present invention, the controller comprises second logic connected to the shift register for applying a clock signal to the latches until the contents of the last latch of the shift register periodically varies over at least three cycles.

The electronic component and trimming components may be resistors. Alternatively, the electronic component and trimming components may be capacitors or inductors.

The trimming components may be connectable in parallel with the electronic component via the switches. Alternatively, the trimming components may be connectable in series with the electronic component via the switches.

In a preferred embodiment of the present invention to be described shortly, there is provided a component value trimming system comprising: a main component, a plurality of trimming components, and a controller for selectively connecting the trimming components in circuit with the main component. The trimming components are used to provide correction to the value of the main component. Specifically, the controller may comprise a shift register for selectively switching the trimming components into circuit with the main component.

The shift register greatly simplifies the controller because the trimming process is reduced to a fixed unit correction being made and convergence to the target value can be relatively easily detected. The system can be conveniently implemented. The system is also advantageously scalable, with the number of elements increasing with desired accuracy. The system can be activated simply by applying a gated clock. Additionally, the system is sufficiently compact for application to each of a plurality of components in an IC, making autonomous control practical. The shift register also provides local memory to the system, allowing the retention of the desired value following calibration and thereby minimizing power consumption.

The present invention advantageously compensates for the tolerance of integrated electronic components such as resistors and provides a more accurate value of such components than could be obtained with an uncompensated component. There are various applications in which well controlled on-chip component networks such as resistor networks are desirable. An example of such an application is the termination of transmission line systems to optimize signal quality. Other examples will be apparent to those skilled in the art.

A preferred embodiment of the present invention advantageously corrects tolerance in an integrated resistor by switching in parallel correcting elements. This technique minimizes the devices required because the system is compensating only the electronic component, thereby minimizing parasitic loading of the network. Reduced parasitics are important in high frequency applications providing improved device performance. The integrated resistor may be employed in a termination network. Such a network is often operated at relatively high frequencies. It is therefore important that, at the frequency of operation, the impedance of the network is close to its low frequency impedance or resistance.

The resistance value set by preferred embodiments of the present invention may be defined primarily by the value of a reference resistor. This value can be consequently independent to a first approximation of any other variables. The reference resistor can be a discrete component with tight control of value and tolerance. Moreover, the reference resistor may be operated at DC and need not then maintain accuracy at signal frequencies experienced by the network.

In a particularly preferred embodiment of the present invention, many distributed networks are controlled via a common control vector. The vector allows cross talk and noise coupling between networks to be effectively eliminated.

BRIEF DESCRIPTION OF THE DRAWINGS

Preferred embodiments of the present invention will now be described, by way of example only, with reference to the accompanying drawings in which.

DETAILED DESCRIPTION OF THE INVENTION

Figure 1:
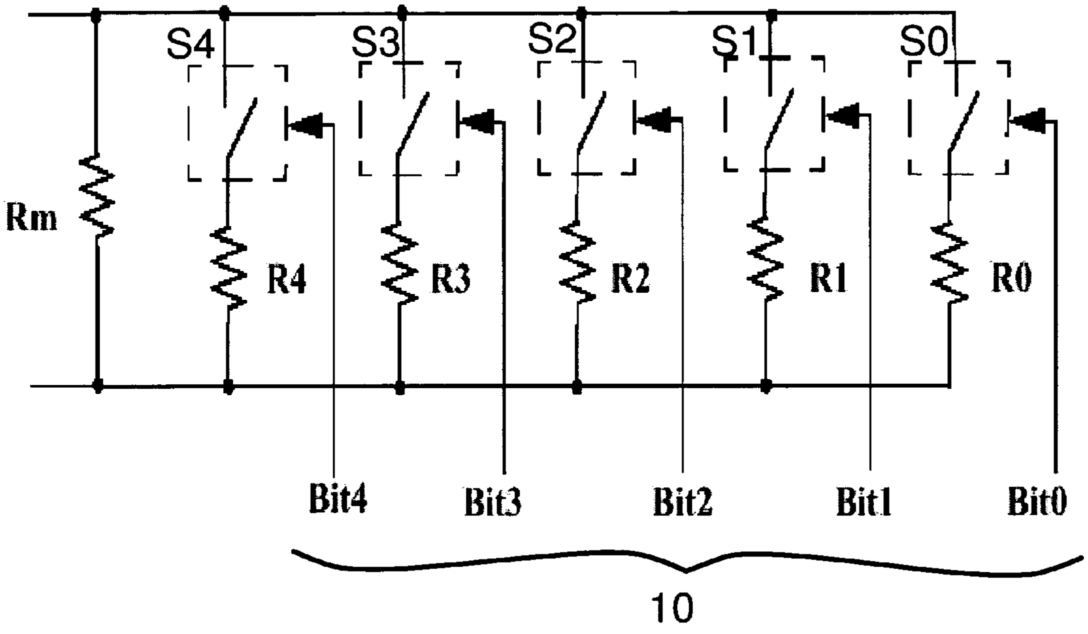
FIG. 1 is a simplified circuit diagram of a component network.

Referring to FIG. 1, in a preferred embodiment of the present invention, there is provided a network comprising a main resistor Rm and plural parallel trimming resistors R0–R4 each selectively connectable in parallel with the main resistor Rm via a corresponding one of a plurality of series switches S0–S4. The trimming resistors R0–R4 are employed to compensate for the tolerance of the main resistor Rm. The trimming resistors R0–R4 may be switched in or out of circuit by a digital control vector 10. The control vector has 5 bits, Bit0–Bit4. Each bit is applied to a control electrode of a different one of the switches S0–S4. In other embodiments of the present invention, the control vector 10 may have more than or less than 5 bits. The switches S0–S4 may be conveniently implemented by transistor switches. In a particularly preferred embodiment of the present invention, the switches S0–S4 are each implemented by a field effect transistor having a channel connected in series with the corresponding one of the trimming resistors R0–R4 and a gate electrode connected to the corresponding bit of the control vector 10.

In a particularly preferred embodiment of the present invention, the trimming resistors R0–R4 are substantially identical. The main resistor Rm is made higher by at least its maximum tolerance than a target value to be reached by the network. By switching into circuit an appropriate number of the trimming resistors R0–R4, the network can be set to a value close to the target. The accuracy of trimming is dependent on the resolution of the vector 10 and the value of the trimming resistors R0–R4. In other words, the accuracy of trimming depends on the number and value of the trimming resistors R0–R4. The value of trimming resistors R0–R4 is preferably set such that their collective contribution to the network compensates for the extra resistance of the main resistor Rm at its maximum tolerance. Thus, the network can be configured to produce a net resistance value close to the target value. For example, the trimming resistors R0–R4 may be substantially higher in value than the main resistor Rm to provide incremental adjustment of the net resistance of the network when placed in parallel with the main resistor Rm.

Figure 1A:
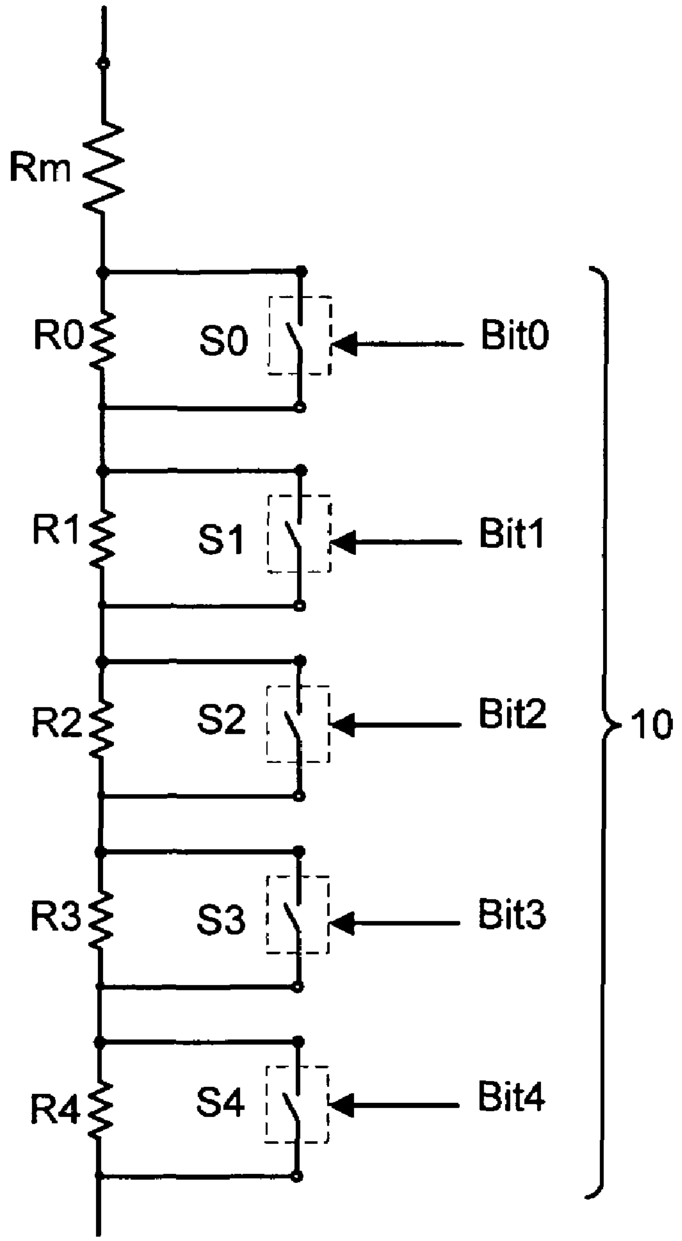
FIG. 1A is a simplified circuit diagram of another component network topology.

The system effectively corrects for the tolerance on the main resistor Rm alone. This advantageously reduces the signal current carried by the trimming resistors R0–R4. Also, this reduces parasitic loading of the network. It be appreciated that other network topologies are possible. FIG. 1A illustrates one embodiment, of the present invention in which the trimming resistors R0–R4 may be connected in series with the main resistor Rm. In such embodiments, the main resistor Rm would be set to a lower value than the target. The control vector 10 is generated by a controller.

Figure 2:
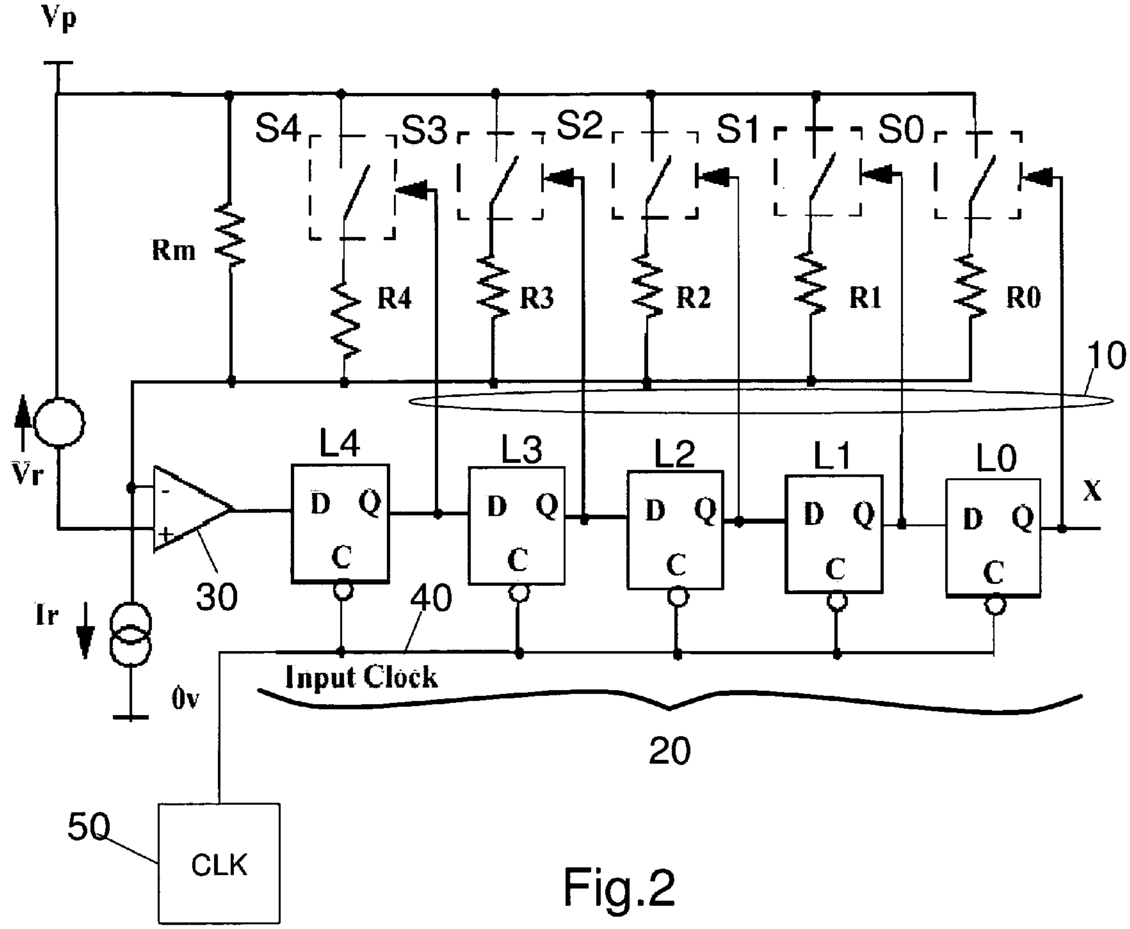
FIG. 2 is a block diagram of an electronic component value trimming system embodying the present invention.

Referring now to FIG. 2, in a preferred embodiment of the present invention, the controller comprises a shift register 20 for providing the control vector 10. The shift register 20 comprises a plurality of D type latches L0–L4. In other embodiments of the present invention, different latches may be employed in the shift register 20, such as J–K latches, for example. Each of the latches L0–L4 corresponds to different bit of the control vector 10. Each of the trimming resistors R0–R4 is controlled by a different one of the latches L0–L4 in the shift register 20. Specifically, a logic '1' on the output Q of one of the latches L0–L4 in the shift register 20 turns the corresponding one of the switches S0–S4 on and connects the corresponding one of the trimming resistors R0–R4 in parallel with the main resistor Rm in the network.

The input to the shift register 20 is connected to and controlled by the output of a comparator 30. In operation, the comparator 30 senses the net resistance of the network. The comparator 30 compares the sensed net resistance offered by the network to a preset, target value. If the net resistance is below the target then the voltage drop across the network will be less than Vr. Consequently the – input of the comparator 30 will be higher than the + input of the comparator 30. Accordingly, the comparator output will be 0. If the net resistance is above the target, then the voltage drop across the network will be greater than Vr. Consequently, the – input of the comparator 30 will be below the + input of the comparator 30. Accordingly, the comparator output will be 1. A logic '0' on the output of the comparator 30 indicates that the net resistance 30 is below the target. A logic '1' on the output of the comparator 30 indicates that the net resistance of the network is above the target.

The comparator 30 is implemented here by a voltage comparator and the target is in the form of a reference voltage Vr. In operation, the comparator 30 senses the error between the reference voltage Vr and the voltage developed across the network when biased by a reference current Ir. If the reference current Ir is set by Ir=Vr/Rref, where Rref is a resistor reference such as an external precision resistor, then the comparator 30 is effectively comparing the network resistance to the resistor reference. It will be appreciated that other techniques for implementing the comparator 30 are equally possible.

Shift operations in the shift register 20 are controlled by a clock pulse signal 40 produced by a clock signal generator 50. As the shift register 20 is clocked by the clock signal 40, the output of the comparator 30 is sequentially propagated through the latches L0–L4. If the output of the comparator 30 is logic '0' state, indicating that the net resistance is low compared to the target value, then successive trimming resistors R0–R4 are switched off as the logic '0' is propagated through the latches L0–L4. When the target is reached, the output of the comparator 30 switches to logic '1'. The next clock pulse then propagates a logic '1' into the latches L0–L4. The net resistance offered by the network then oscillates about the target with successive clock pulses. Specifically, the net resistance of the network is switched either side of the target with successive clock pulses.

Figure 3:
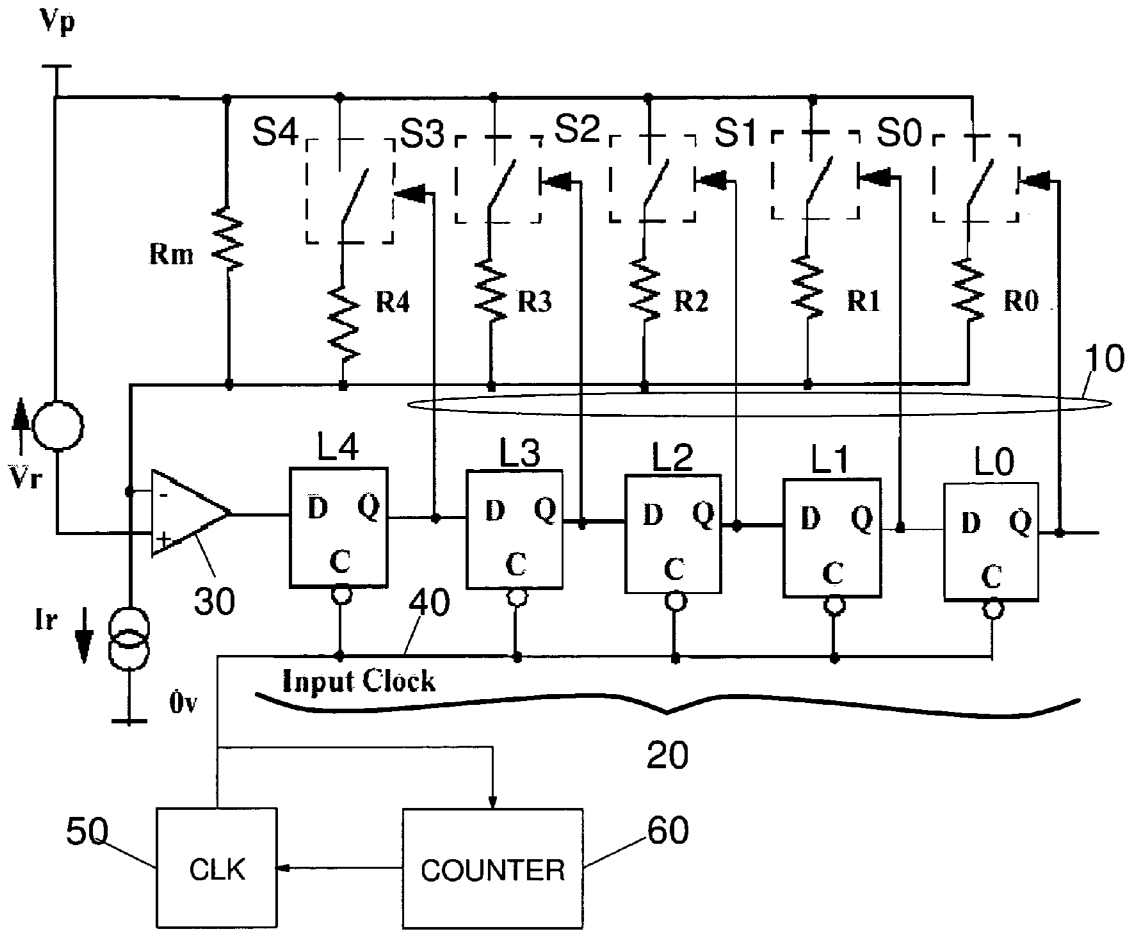
FIG. 3 is a block diagram of another electronic component value trimming system embodying the present invention.

Referring to FIG. 3, in a first preferred embodiment of the present invention, the aforementioned oscillations about the target value are reduced by gating the clock signal 40 at the clock generator 50. Specifically, the clock signal 40 is applied to the clock inputs C of the latches L0–L4 in the shift register 20 for an interval which is at least sufficient to propagate the initial output of the comparator 30 through all of the latches L0–L4. The interval is determined by a counter 60 connected to the clock generator 60. In operation, the counter 60 counts pulses in the clock signal 40. When the count maintained by the counter 60 reaches the interval, the counter 60 inhibits the clock signal 40 at the clock generator 50. The net resistance of the network thus converges to one of the two values either side of the target. If the number of trimming resistors R0–R4 is sufficient then the net resistance converges to within acceptable tolerance of the target. When the clock signal 40 is gated off, the shift register 20 holds the appropriate states for the configuring the trimming resistors R0–R4. This arrangement has the advantage that shift register need not be preconditioned. Initially, all bits in the control vector 10 can be set to logic '1', so that all switches S0–S4 are closed. Equally however, all bits in the control vector can be initially set to logic '0', so that all switches S0–S4 are open. Alternatively, the control vector 10 can equally comprise a random pattern of '1's and '0', leaving a correspondingly random pattern of switches S0–S4 open and closed. It will also be appreciated that, in other embodiments of the present invention, a logic '0' in the control vector 10 may close a corresponding switch S0–S4 instead of a logic '1'.

In an especially preferred embodiment of the present invention the comparator 30 is gated off at the same time as the clock signal 40, thus reducing power consumption in the system to a negligible level. The gated clock signal 40 can be thought of here as an open loop control signal. Specifically, the clock signal 40 is simply supplied for a limited number of cycles equal to the number of latches in the shift register 20. A single control line may be used to control the system. It will be appreciated that gated clock systems as herein before described are advantageous in their simplicity.

Figure 4:
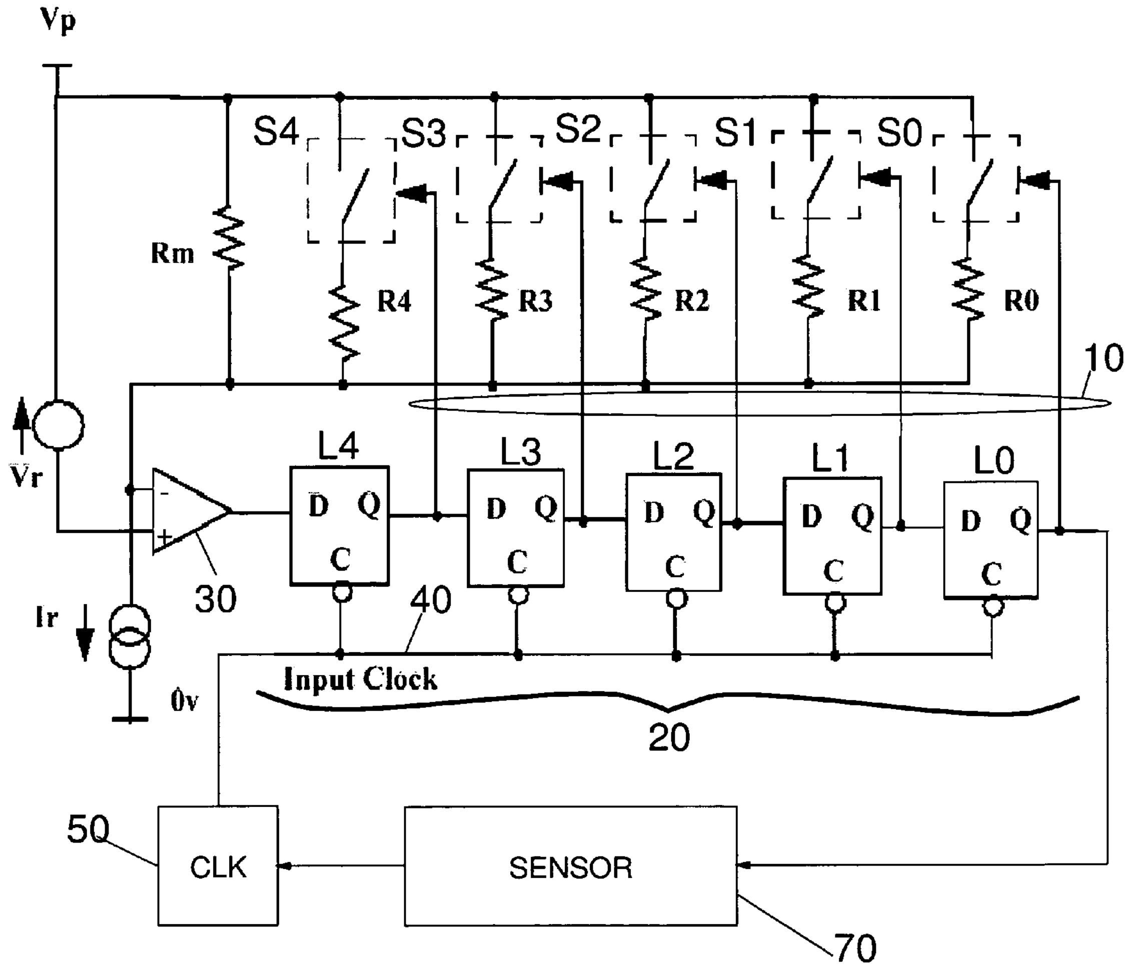
FIG. 4 is a block diagram of yet another electronic component value trimming system embodying the present invention.

Referring to FIG. 4, in a second preferred embodiment of the present invention, the clock signal 40 is also gated. Now however, sensor logic 70 is connected to the output of the last latch L4 in the shift register 20. The output of the sensor logic 70 is connected to the clock generator 50. In operation, the sensor logic 70 detects when an alternating bit pattern at the output of the last latch of the shift register 20 is periodic over three cycles. Such periodicity is indicative of the control vector 10 reaching steady state.

At this point, the net resistance is oscillating about the target. On detection of such an alternating bit pattern, the output the sensor logic 70 is set to disable the clock signal 40 at the clock generator 50 so that the net resistance of the network is set to one of the aforementioned values either side of the target. For example, if the net resistance is required to be lower than the target, to compensate for parasitic wiring resistance for example, then the shift register 20 can be disabled immediately after the next '1' is propagated.

The aforementioned first embodiment may be useful in many different circuit applications. The error introduced in the first embodiment can be compensated by increasing the number of trimming resistors R0–R4 and correspondingly reducing the weighting of each trimming resistor R0–R4 to the net resistance. Depending on the application, this may more efficient in terms of circuit complexity and performance than including extra circuitry such as the sensor circuitry employed in the aforementioned second embodiment.

The embodiments of the present invention herein before described are advantageously scalable. Where greater accuracy is required, the number of trimming resistors R0–R4 and the corresponding number of latches L0–L4 in the shift register 20 can simply be increased.

In an IC layout design of an embodiment of the present invention, each corresponding switch S0–S4, resistor R0–R4, and latch L0–L4 can be produced as a common cell. Such cells can be conveniently cascaded. Consequently, systems embodying the present invention can be produced on the same IC with different numbers of trimming resistors R0–R4 and therefore different accuracy. This advantageously permits optimization of systems on a common IC in dependence on application. For example, a termination resistor for a driver may require less accuracy than a termination resistor for a receiver. Scalable systems embodying the present invention allow significant area savings.

In the preferred embodiments of the present invention herein before described, a resistor value is corrected by switching in parallel trimming resistors R0–R4 each having the same value. This sequential technique is advantageous over techniques involving trimming resistors of different weights. This is because disturbance to the network is reduced. The disturbance is reduced because only one of the trimming resistors R0–R4 is added or removed at a time. The simplicity of systems embodying of the present invention permits practical implementation for individual networks and simple convergence to the target.

Advantageously, systems embodying the present invention have low power consumption because power is only consumed during initial calibration. Thereafter, the required control vector 102 can be retained in the shift register 20. The comparator 30, together with sources for Vr and Ir, can be powered down.

Systems embodying the present invention are also advantageous in applications where power supply voltages are relatively low because the trimming can be conveniently controlled via the digital switches S0–S4. The comparator 30 can be implemented so as to minimize voltage headroom requirements. The minimum power supply voltage can be, for example, Vr plus the voltage compliance of the current source for Ir. As indicated earlier, the net resistance can be set primarily by the value of a reference resistor. The reference resistor can be in the form of an external precision resistor. Such an external resistor can be advantageously independent of and thus unaffected by other variables in the IC.

The vector 102 can be used to set plural networks of the forms herein before described. Thus, a single controller having a single shift register 20 can set multiple networks distributed across a chip via a common vector 102. The accuracy of the net resistance of these 'slave' networks is determined by the accuracy of the controller in combination with the matching tolerance between the networks.

In summary, preferred embodiments of the present invention provide an adaptive network that uses individually connectable trimming components to compensate for the tolerance on a main component. Embodiments of the present invention have been herein before described with reference to trimming a resistance value. It will appreciated however that the present invention is equally applicable to trimming the value of other electrical components, such as capacitors and inductors, for example.

What is claimed is:

1. An apparatus for trimming the value of an electronic component, the apparatus comprising:

at least one trimming component, each trimming component having an associated switch for selectively connecting the trimming component to an electronic component in response to a corresponding bit in a control vector;

a comparator for generating an output bit having a first value a net value of the electronic component and any connected trimming components differs from a desired value;

a controller connected to the switches and the comparator for generating the control vector in dependence on the output bit of the comparator, the controller comprising a shift register for sequentially receiving successive output bits from the comparator, wherein the control vector comprises contents of the shift register and wherein each bit of the control vector effects switching of each corresponding switch; and a counter configured to disable a clock signal, which applied to the shift register, on detection of a predetermined number of cycles in the clock signal.

2. The apparatus of claim 1, wherein the switches are initially closed.

3. The apparatus of claim 1, wherein the switches are initially open.

4. The apparatus of claim 1, wherein the shift register comprises a plurality of latches connected in series, said latches including a first latch and a last latch, the output of the comparator being connected to the first latch in the series of latches.

5. The apparatus of claim 4, wherein the controller comprises a first logic for applying a clock signal to the latches until all latches in the series of latches have changed state in response to the output bit of the comparator.

6. The apparatus of claim 5, wherein the controller comprises a second logic connected to the shift register for applying a clock signal to the latches in response to the contents of the last latch of the shift register periodically varies over at least three cycles.

7. The apparatus of claim 1, wherein the counter disables the comparator on detection of die predetermined number of cycles in the clock signal.

8. The apparatus of claim 1, wherein the electronic component and the trimming components are a group consisting of resistors, inductors, and capacitors.

9. The apparatus of claim 1 wherein the trimming components are connectable in parallel with the electronic component via the switches.

10. The apparatus of claim 1, wherein the trimming components are connectable in series with the electronic component via the switches.

11. An apparatus for trimming the value of an electronic component, the apparatus comprising:

at least one trimming component, each trimming component having an associated switch for selectively connecting the trimming component to an electronic component in response to a corresponding bit in a control vector;

a comparator for generating an output bit having a first value if a net value of the electronic component and any connected trimming components differs from a desired value;

a controller connected to the switches and the comparator for generating the control vector in dependence on the output bit of the comparator, the controller comprising a shift register comprising a plurality of latches connected in series, said latches including a first latch and a last latch, the output of the comparator being connected to the first latch in the series of latches for sequentially receiving successive output bits from the comparator, wherein the control vector comprises contents of the shift register and wherein each bit of the control vector effects switching of each corresponding switch; and a counter configured to disable a clock signal, which applied to the shift register, on detection of a predetermined number of cycles in the clock signal.

12. A system for trimming the value of the electronic component, the system comprising:

an electronic component; and a trimming apparatus connected to the electronic component, the trimming apparatus comprising at least one trimming component, each trimming component having an associated switch for selectively connecting the trimming component to an electronic component in response to a corresponding bit in a control vector;

a comparator for generating an output bit having a first value if a net value of the electronic component and any connected trimming components differs from a desired value;

a controller connected to the switches and the comparator for generating the control vector in dependence on the output of the comparator, the controller comprising a shift register for sequentially receiving successive output bits from the comparator, wherein the control vector comprises contents of the shift register and wherein a bit of said first value in the control vector effects switching of the corresponding switch; and a counter configured to disable a clock signal, which applied to the shift register, on detection of a predetermined number of cycles in the clock signal.

13. The system of claim 12, wherein the switches are initially closed.

14. The system of claim 12, wherein the switches are initially open.

15. The system of claim 12, wherein the shift register comprises a plurality of latches connected in series, said latches including a first latch and a last latch, the output of the comparator being connected to the first latch in the series of latches.

16. The system of claim 15, wherein the controller comprises a first logic for applying a clock signal to the latches until all latches in the series of latches have received an output bit from the comparator.

17. The system of claim 16, wherein the controller comprises a second logic connected to the shift register for applying a clock signal to the latches in response to the contents of the last latch of the shift register periodically varies over at least three cycles.

18. The system of claim 12, wherein the electronic component and the trimming components are selected from the group consisting of resistors, capacitors, and inductors.

19. The system of claim 12, wherein the trimming components are connectable in parallel with the electronic component via the switches.

20. The system of claim 12, wherein the trimming components are connectable in series with the electronic component via the switches.

21. A signal bearing medium tangibly embodying a program of machine-readable instructions executable by a digital processing apparatus to perform an operation to trim the value of an electronic component, the operation comprising:

selectively connecting at least one trimming component to an electronic component in response to a corresponding bit in a control vector, each trimming component having an associated switch;

generating a first value of an output bit if a net value of the electronic component and any connected trimming components differs from a desired value;

generating the control vector in a controller in dependence on the output bit, the controller comprising a shift register for sequentially receiving successive output bits, wherein the control vector comprises contents of the shift register and wherein a bit of said first value in the control vector effects switching of the corresponding switch; and disabling a clock signal, which applied to the shift register, on detection of a predetermined number of cycles in the clock signal.

22. The signal bearing medium of claim 21, wherein the switches are initially closed.

23. The signal bearing medium of claim 21, wherein the switches are initially open.

24. The signal bearing medium of claim 21, wherein the instructions further comprise an operation to generate the control vector by successively applying the first value of the output bit sequentially to a plurality of latches connected in series, said latches including a first latch and a last latch, the first value of the output bit being applied to the first latch in the series of latches.

25. The signal bearing medium of claim 24, wherein the instructions further comprise an operation to apply a clock signal to the latches until all latches in the series of latches have changed state in response to the output bit.

26. A method to trim the value of an electronic component, the method comprising:

selectively connecting at least one trimming component to an electronic component in response to a corresponding bit in a control vector, each trimming component having an associated switch;

generating a first value of an output bit if a net value of the electronic component and any connected trimming components differs from a desired value;

generating the control vector in a controller in dependence on the output bit, the controller comprising a shift register for sequentially receiving successive output bits, wherein the control vector comprises contents of the shift register and wherein a bit of said first value in the control vector effects switching of the corresponding switch; and disabling a clock signal, which applied to the shift register, on detection of a predetermined number of cycles in the clock signal.

27. An apparatus to trim the value of an electronic component, the apparatus comprising:

means for selectively connecting at least one trimming component to an electronic component in response to a corresponding bit in a control vector, each trimming component having an associated switch;

means for generating a first value of an output bit if a net value of the electronic component and any connected trimming components differs from a desired value;

means for generating the control vector in a controller in dependence on the output bit, the controller comprising a shift register for sequentially receiving successive output bits, wherein the control vector comprises contents of the shift register and wherein a bit of said first value in the control vector effects switching of the corresponding switch; and means for disabling a clock signal, which applied to the shift register, on detection of a predetermined number of cycles in the clock signal.

* * * * *